United States Patent [19]

Murayama et al.

[11] Patent Number: 5,474,611
[45] Date of Patent: Dec. 12, 1995

[54] PLASMA VAPOR DEPOSITION APPARATUS

[75] Inventors: Yoichi Murayama; Toshio Narita, both of Tokyo, Japan

[73] Assignees: Yoichi Murayama, Shincron Co., Ltd.; C. Itoh Fine Chemical Co., Ltd., Tokyo, Japan

[21] Appl. No.: 292,228

[22] Filed: Aug. 22, 1994

Related U.S. Application Data

[63] Continuation-in-part of Ser. No. 63,040, May 18, 1993, abandoned.

[30] Foreign Application Priority Data

May 20, 1992 [JP] Japan ................................. 4-127810
Apr. 26, 1993 [JP] Japan ................................. 5-099880

[51] Int. Cl.⁶ ................................................. C23C 16/00
[52] U.S. Cl. ............................ 118/723 VE; 118/723 EB; 118/718; 118/719; 118/725; 204/298.05
[58] Field of Search ................................. 118/718, 719, 118/723 VE, 723 EB, 725; 204/298.05

[56] References Cited

U.S. PATENT DOCUMENTS

| 3,962,988 | 6/1976 | Murayama et al. | 204/298.05 |
| 4,392,451 | 7/1983 | Mickelsen et al. | 118/718 X |
| 4,416,217 | 11/1983 | Nakamura et al. | 118/718 X |

FOREIGN PATENT DOCUMENTS

| 52-53778 | 4/1977 | Japan | 204/298.05 |
| 57-145044 | 9/1982 | Japan | |
| 62-37367 | 2/1987 | Japan | 204/298.05 |
| 62-174371 | 7/1987 | Japan | 204/298.05 |
| 62-222078 | 9/1987 | Japan | 204/298.05 |
| 64-65259 | 3/1989 | Japan | 204/298.05 |
| 2-182876 | 7/1990 | Japan | 204/298.05 |

Primary Examiner—R. Bruce Breneman
Assistant Examiner—Joni Y. Chang
Attorney, Agent, or Firm—Wenderoth, Lind & Ponack

[57] ABSTRACT

A plasma vapor deposition apparatus which can form high-quality films of ITO, for example, with high productivity, includes a vapor deposition chamber, a drive and a horizontally rotating circular holding plate connected to the drive located in a lower portion of the chamber, the circular holding plate having a circular vapor source material mounting centered at the rotational axis about which the plate is rotated by the drive, and coil-shaped electrodes for exciting vapor produced by evaporating the vapor source material. A film thickness correcting plate is interposed between the holding plate and the path along which the substrate is transported through the chamber by a transporting device. This plate is configured to so shield a portion of the substrate so that an excess of excited vapor particles do not accumulate at a given site on the surface of the substrate. Moreover, independently evacuatable evacuating sections are provided upstream and downstream of the vapor deposition chamber to constitute a processing line. The transporting device transports the substrate continuously along a first path through the processing line from an inlet section to an outline section. On the other hand, a return mechanism returns the substrate from the outlet section to the inlet section along a second path disposed above the first path.

11 Claims, 13 Drawing Sheets

PLASMA VAPOR DEPOSITION APPARATUS

This application is a continuation-in-part of now abandoned application, Ser. No. 08/063,040, filed May 18, 1993.

BACKGROUND OF THE INVENTION

1. Field of the Invention

The present invention relates to a plasma vapor deposition apparatus. More particularly, the present invention relates to an inline plasma vapor deposition apparatus which can form a high-quality film with a high degree of efficiency and is useful for forming a multilayered film.

2. Description of the Related Art

A high-quality thin film and a multilayered film have been researched and developed along with the rapid development of technical innovations in such areas as electronics and optoelectronics.

For the purpose of forming such a thin film, various methods including vacuum vapor deposition, sputtering and plasma vapor deposition have been considered, and some of these methods have already been put into practice.

Among these methods, sputtering is known for its excellent productivity, and high-frequency excitation, particularly plasma vapor deposition based on plasma excitation using coil-shaped electrodes is, on the other hand, known to impart excellent properties, such as uniformity and adhering strength, to the film.

According to these conventional methods, however, forming a quality and high-performance film is not always compatible with achieving high productivity. It has, therefore, been very difficult to form liquid crystal cells with high productivity, and to form a multilayered film continuously.

The sputtering method, for example, is deficient in that it cannot be used, without difficulty, to uniformly distribute film-forming substances on a substrate or to achieve a uniform chemical composition of a film, and pinholes and film deterioration occur easily. Therefore, plasma vapor deposition has given rise to higher expectations.

Plasma vapor deposition, however, requires taking greater care than in sputtering as to the exciting means and creation of a vacuum which govern the formation of the plasma and as to the handling of the vapor source materials. Accordingly, it has not been easy to adopt such a method as a continuous process achieving high productivity.

The present inventor has proposed, for example, a plasma vapor deposition apparatus having a plurality of vapor deposition sections partitioned with electromagnetic shielding plates, arranged in succession (Japanese Patent Publication No. 55-21109). Even this apparatus, however, has limits on the formation of a high-quality film with a high degree of efficiency. It cannot be used to form a multilayered film.

SUMMARY OF THE INVENTION

An object of the present invention, therefore, is to provide a novel inline plasma vapor deposition apparatus which solves the above-mentioned drawbacks in the prior art, by which high-quality high-performance films can be produced with high productivity and by which a multilayered film can be formed.

To achieve this object, the present invention provides a vacuum plasma vapor deposition apparatus which comprises a vapor source supply means, and a high-frequency exciting means and a substrate holding means arranged above the vapor source supply means. The vapor source supply means has a drive and at least one circular holding plate connected thereto and rotating horizontally. The circular holding plate(s) is rotated by the drive about a vertical axis passing through the center of a circular vapor source material carrying section on the surface of the holding plate. The high-frequency exciting means includes coil-shaped electrodes. Further, a thickness correcting plate is interposed between the vapor source supply means and the substrate. The thickness correcting plate is configured to shield the substrate and prevent an excess of excited particles from accumulating at a given site on the surface of the substrate due to the configuration of the vapor supply means and other film forming conditions, to thereby ensure that the film formed on the substrate has a uniform thickness. The present invention also provides an inline vacuum plasma vapor deposition apparatus which comprises a processing line, an inlet and an outlet section at opposite ends of the processing line, the processing line including one or more vapor deposition sections (as described above) and evacuating sections upstream and downstream of the vapor deposition section and in series therewith, means for continuously transporting a substrate through the vapor deposition and evacuating sections from said inlet section to said outlet section, and return means for returning the substrate from the outlet section to the inlet section.

DETAILED DESCRIPTION OF THE PREFERRED EMBODIMENTS

The vacuum plasma vapor deposition apparatus of the present invention will be described below with reference to the attached drawings. The description "inline" refers to an apparatus of a continuous production line.

Figure 1:
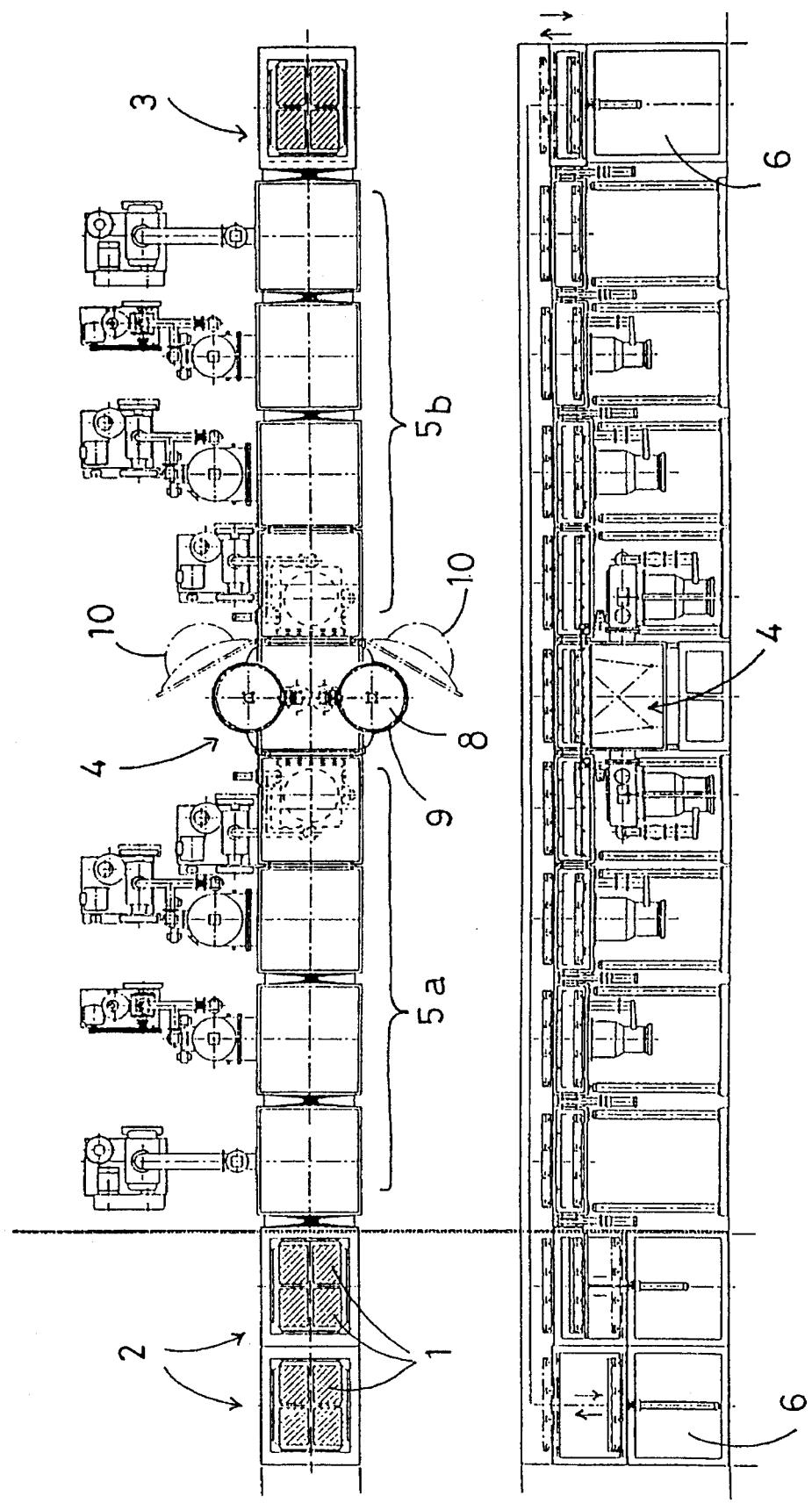
FIG. 1 comprises a plan view and a front view of an embodiment of the inline plasma vapor deposition apparatus of the present invention.
Figure 2:
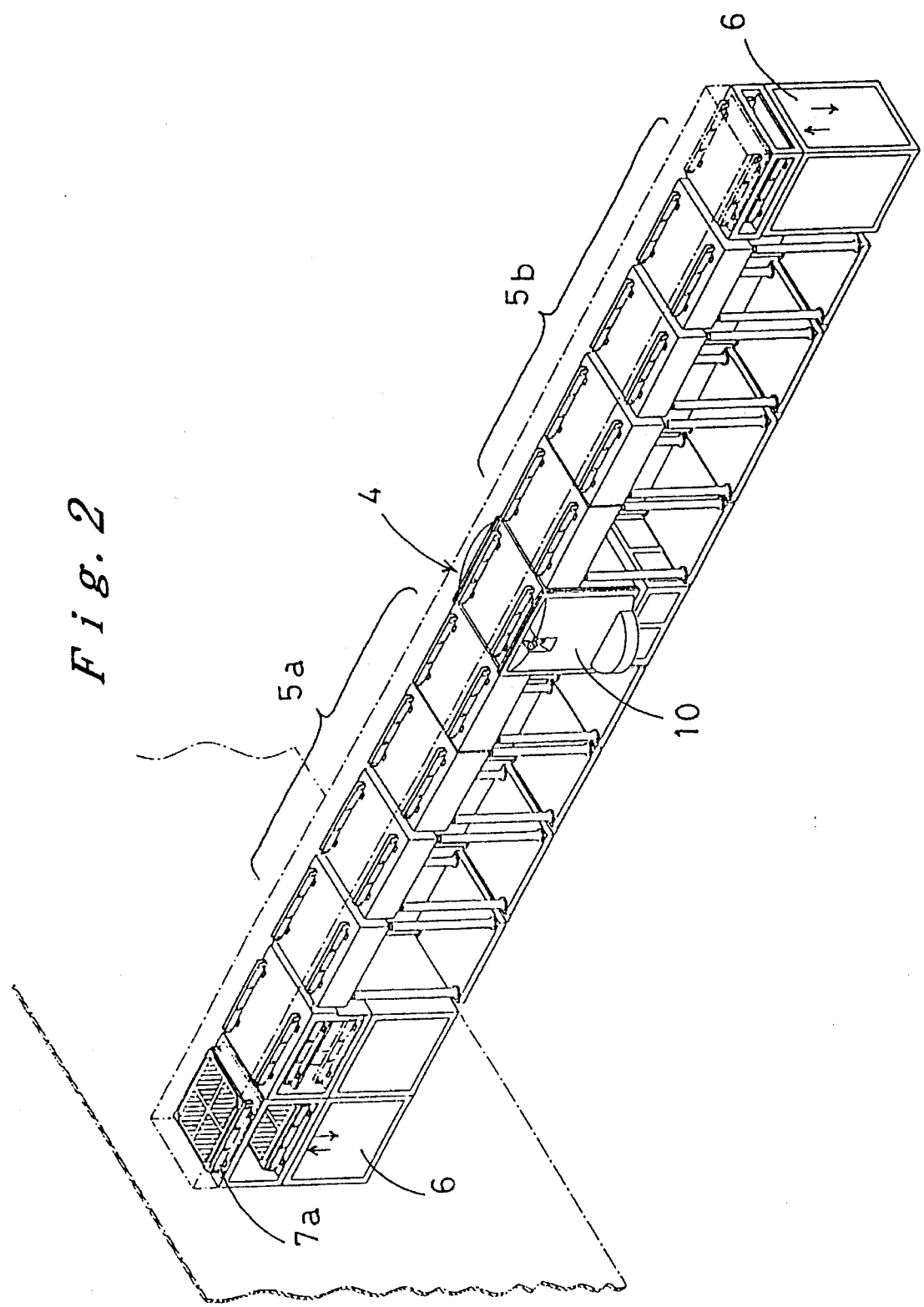
FIG. 2 is a perspective view of the embodiment of the inline apparatus of the present invention.
Figure 3:
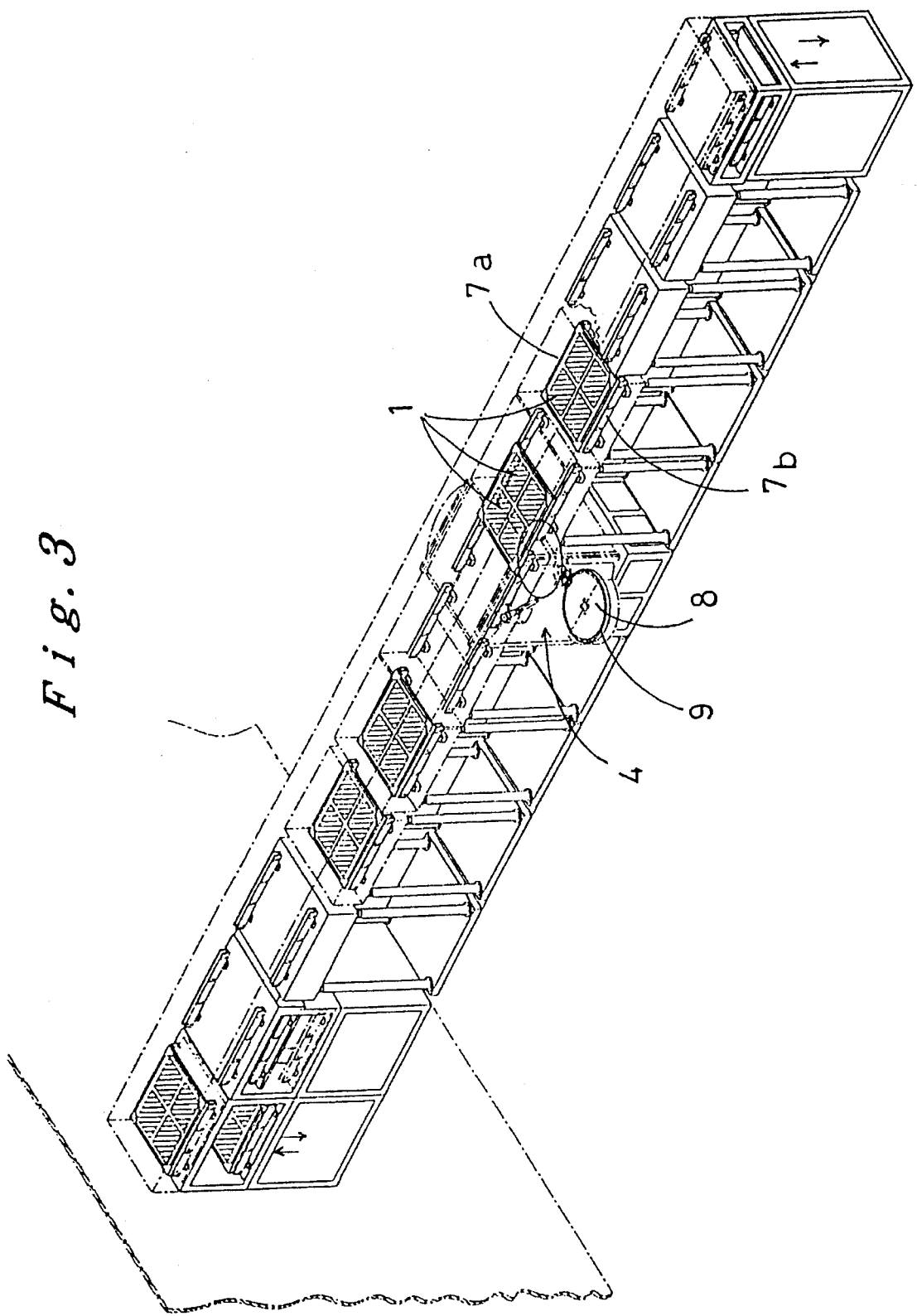
FIG. 3 is a perspective view, partially broken away, of the embodiment of the inline apparatus of the present invention.

In the present invention, as shown in FIGS. 1, 2 and 3, the apparatus has an inlet section (2) and an outlet section (3) at the ends of a processing line thereof, one or more vapor deposition sections (4), and vacuum evacuating sections (5a) and (5b) upstream and downstream of the same, each being independently evacuatable. The inlet (2) and the outlet (3) are each provided with an elevator (6) for raising and lowering a substrate (1).

The apparatus has transport means (7a) and (7b) for causing the substrate (1) to pass continuously through the vapor deposition section (4) and the vacuum evacuating sections (5a) and (5b). FIG. 3 illustrates an example of the transport of the substrate (1). The apparatus is also provided with a return mechanism.

The vapor deposition section (4) of the present invention comprises a vacuum chamber, vapor source material supply means including a vapor source material (9) provided in a circular groove in at least one horizontally rotating holding plate (8) disposed in the vacuum chamber, and a high-frequency exciting means including coil-shaped electrodes (14) disposed below the path along which the substrate (1) travels through the vapor deposition section (4).

The substrate (1) is supported at the inlet section (2) by a moving section (pallet) (7a) of the transport means, and is transported by sliding along opposite rail sections (7b) of the transport means. The substrate (1) is transported through the upstream vacuum evacuating section (5a) which is evacuated, and is introduced into the vapor deposition section (4) under a vacuum. In the vapor deposition section (4), the substrate (1) is subjected to a prescribed film forming treatment, and is then transported to the vacuum evacuating section (5b) downstream of the vapor deposition section. In this case, the substrate (1) may be preliminarily heated at a prescribed point in the vacuum evacuating section (5a). The vacuum evacuating sections (5a) and (5b) form a buffer for the vacuum deposition section (4). The individual vessels of the sections (4), (5a) and (5b) are connected by vacuum gate valves as to allow each section to be independently evacuated.

Figure 4:
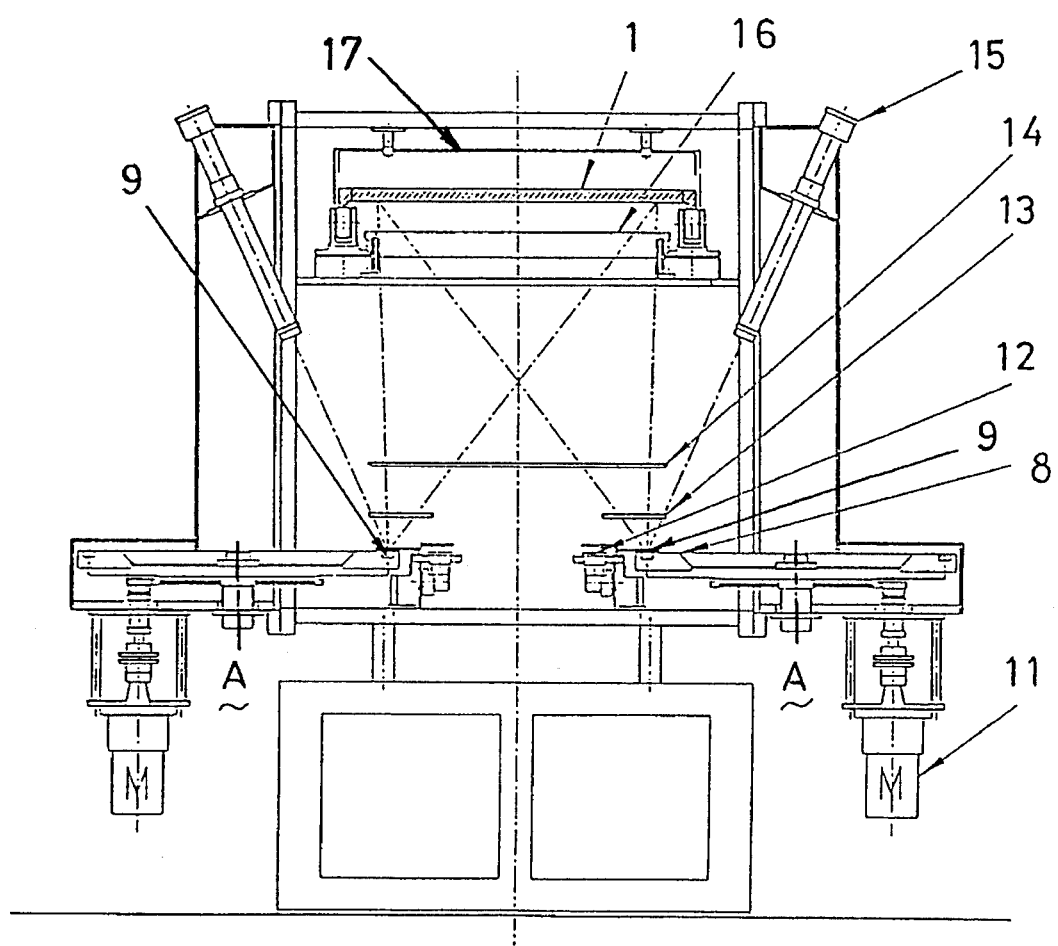
FIG. 4 is a cross-sectional view of a high-frequency exciting vapor deposition section of the present invention.

The vapor deposition section (4) is provided with a high-frequency exciting means comprising coil-shaped electrodes. As shown in FIGS. 1 and 2, for example, doors (10) capable of being opened and closed are provided at both sides of the vapor deposition section (4) with respect to the direction of travel of the substrate (1). As shown in FIG. 4, the holding plate(s) (8) rotates about an axis (A) perpendicular to the direction of travel of the substrate (1). This holding plate (8) is rotated about the center axis (A) by a driving means (11) so that the vapor source material (9) located in the circular groove of the holding plate (8) is continuously and uniformly evaporated. That is, the vapor source material (9) is evaporated by an appropriate means such as a resistance heater, an induction heater, an electron beam (EB) source or an ion beam source.

In the example shown in FIG. 4, an electron beam source (12) irradiates the vapor source material (9) with an electron beam to evaporate the material (9). Evaporated particles of the material are plasma-excited by the high-frequency exciting means comprising coil-shaped electrodes (14) as the vapor passes through the aperture of a shutter (13) controlling the spread of the vapor. The resulting ions and radicals form a film on the substrate (1).

By continuously evaporating the vapor source material (9) provided on the horizontally rotating holding plate (8), and spacing the vapor source supply means from the substrate (1) in a direction perpendicular to the direction of travel of the substrate (1), the evaporation and formation of a film, by plasma excitation of evaporated particles effected by the coil-shaped electrodes, are uniform. Thus the properties of the film, including those of the film structure, film thickness and adhering strength, are made uniform. The condition of the vapor source material (9) can be observed through a quartz monitor (15).

Figure 5:
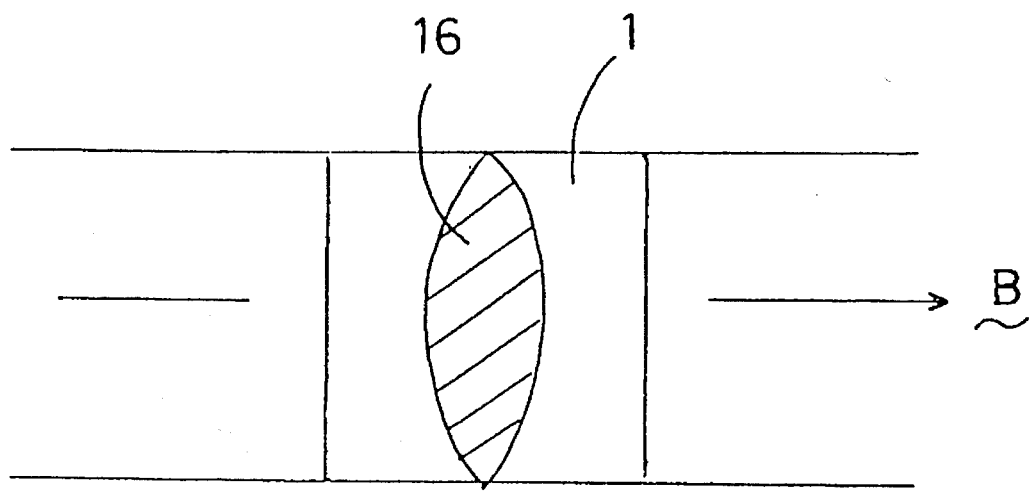
FIG. 5 is a plan view of the film thickness correcting plate of the same.

Although the film is formed during the travel of the substrate (1), the properties of the film are sufficiently uniform. With a view to further ensuring this uniformity, a film thickness correcting plate (16) is provided. This correcting plate (16) is to prevent an excess of the excited particles from accumulating at a given site on the surface of the substrate (1). As shown in FIG. 5, the correcting plate (16) partially shields the substrate (1) as it travels in direction (B). The shape of the plate (16) should be selected according to the configuration of the vapor source material supply means, the type of vapor source material (9), and the condition of film formation. For example, as is rather clear from the chain lines in FIG. 4, the ions and radicals reaching the substrate (1) from both locations at which the vapor source material (9) is evaporated would be concentrated at the center of the substrate (1), i.e. where the overlap of the ions and radicals from both locations is greatest. Thus, the correcting plate (16) is widest at the center thereof corresponding to the central region of the substrate (1), thereby shielding the central region of the substrate (1) to a greater extent during film formation to prevent an excess amount of ions and radicals from impinging the central region.

Further, a heater (17) is preferably provided to heat the substrate (1) from the back thereof, as is also shown in FIG. 4.

The vapor deposition section (4) also includes means for impressing a bias voltage across the substrate (1), and means for supplying a reactive gas and an inert gas for forming the plasma.

High-frequency excited plasma can be produced by the coil-shaped electrodes (14) according to various known techniques: for example, the vapor source material can consist of various solids such as metals, alloys, inorganic matter or polymers; the vacuum in the vapor deposition section (4) is $1 \times 10^{-5}$ to $1 \times 10^{-4}$ Torr; the inert gas can be argon or helium; and oxygen, nitrogen, hydrogen, a hydrocarbon or a polymerizable monomer can be introduced into the vacuum chamber.

For example, by using ITO (indium-tin oxide) as the vapor source material, and introducing an inert gas and oxygen, it is possible to produce high-quality ITO thin films on glass substrates, for example, with high productivity.

It is possible to form this film at a temperature lower than that in the conventional method, such as at temperatures of 200° to 300° C.

Figure 6:
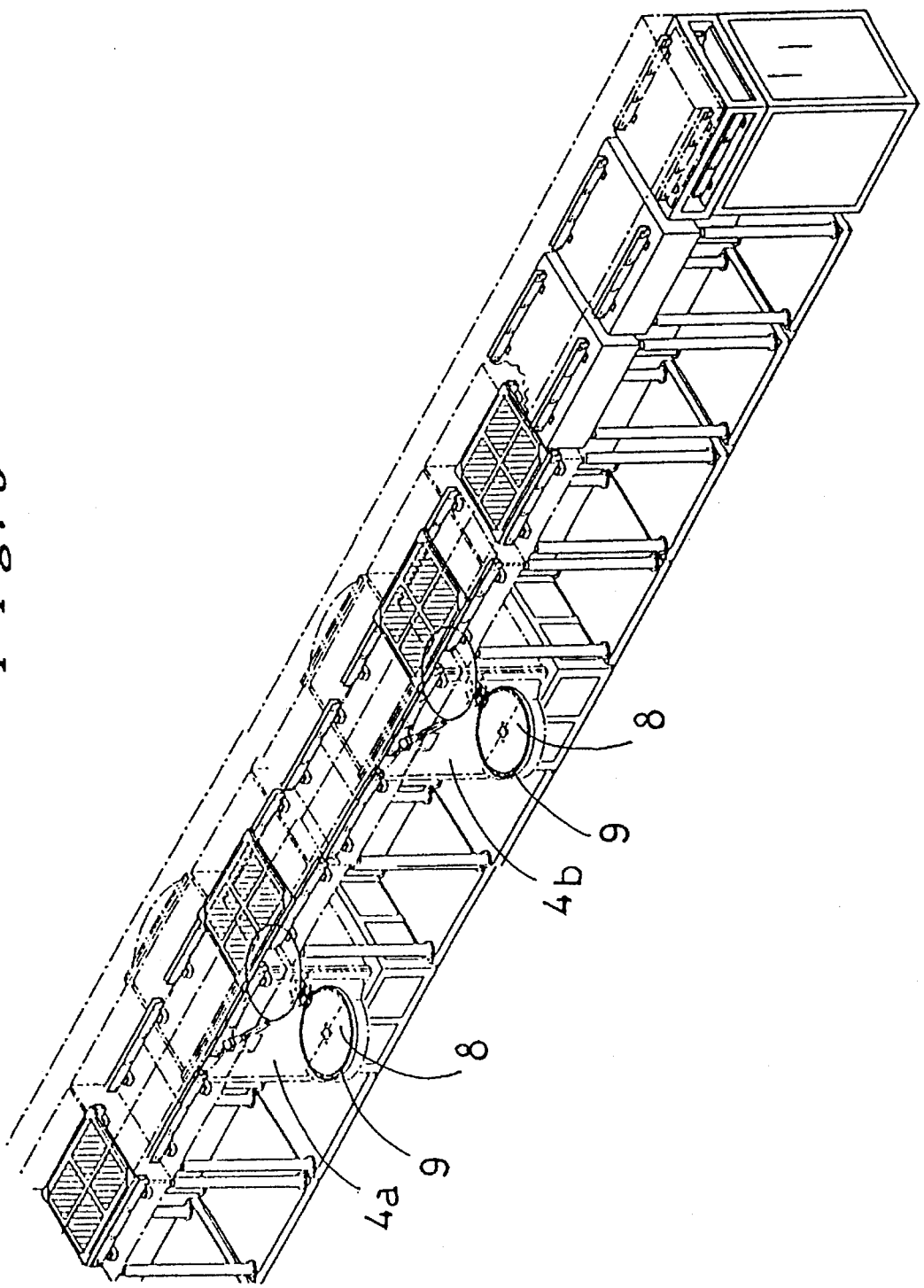
FIG. 6 is a perspective view, partially broken away, of another embodiment of the inline vapor deposition apparatus of the present invention.

In the present invention, as shown in FIG. 6, for example, it is possible to form another film of a different material, or to form another film of the same material at a prescribed portion on the masked substrate, by providing another vapor deposition section downstream of the above-described vapor deposition section, i.e. by providing vapor deposition sections (4a) and (4b).

With this embodiment, a color filter substrate, for example, can be formed. After a metal or an inorganic material has been plasma vapor-deposited on a substrate, an organic thin film is plasma-vapor deposited on the same. Alternatively, multiple layers of a pigment can be plasma-vapor-deposited. Such a color filter can be formed continuously using an ITO film.

Ordinary vacuum vapor deposition or plasma vapor deposition that does not employ coil-shaped electrodes may be used in conjunction with plasma vapor deposition.

Figure 7:
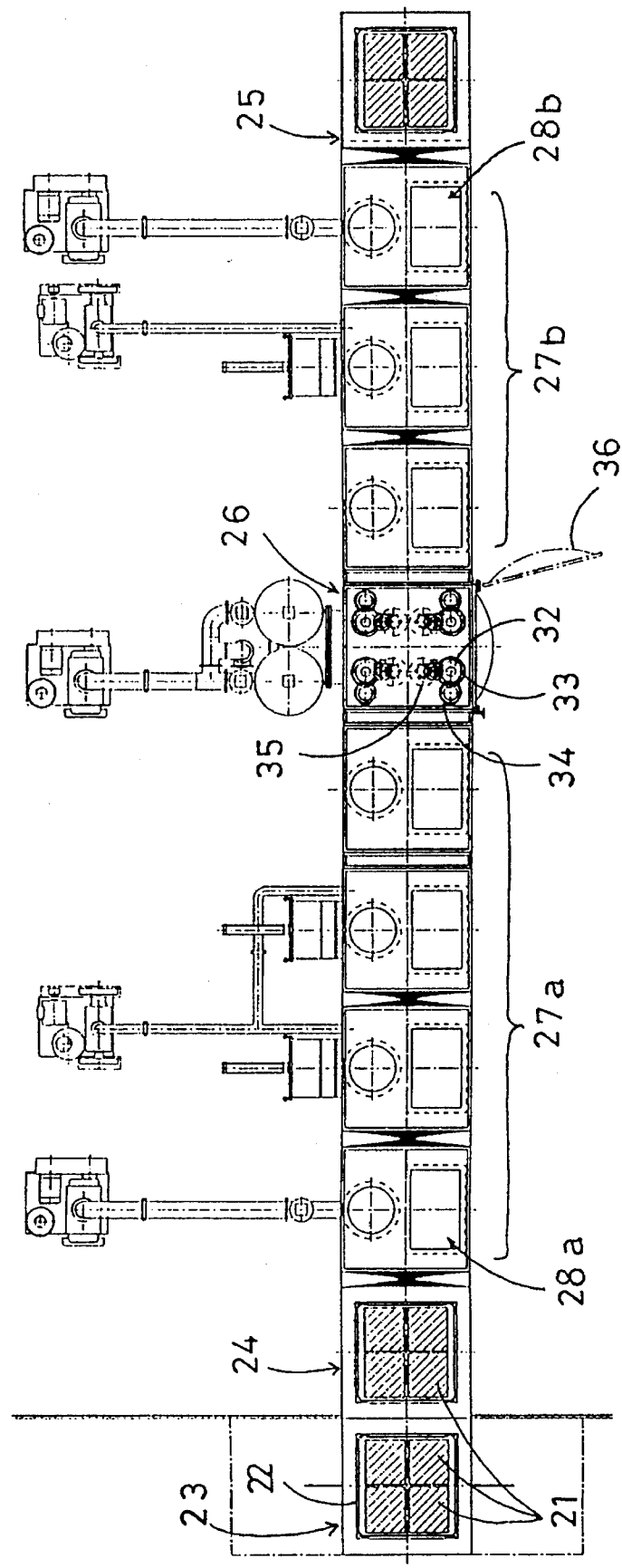
FIG. 7 is a plan view of still another embodiment of the inline vapor deposition apparatus of the present invention.
Figure 8:
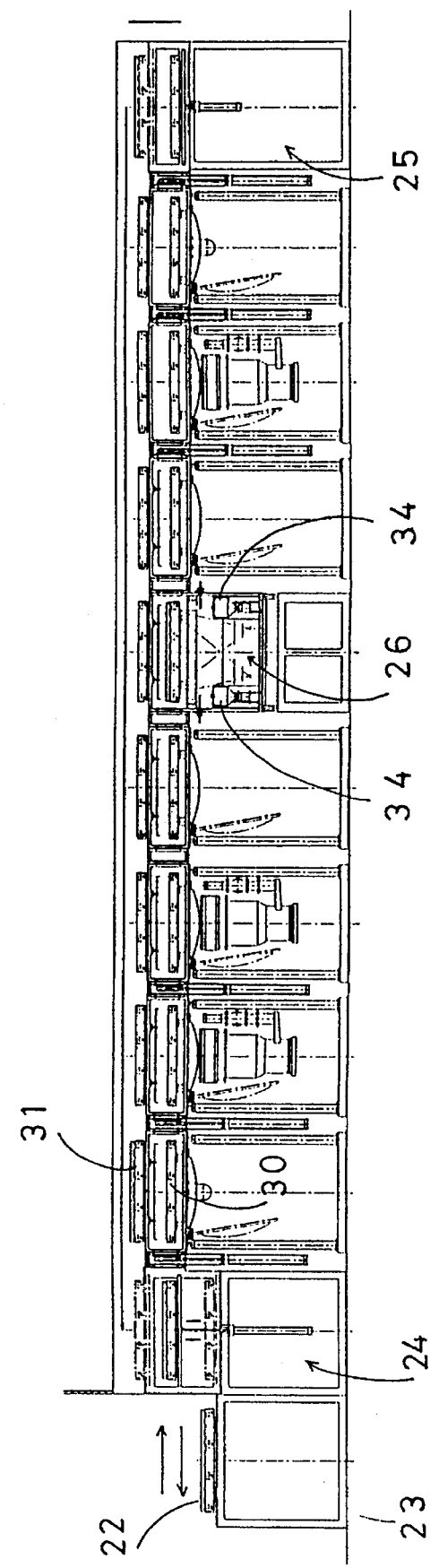
FIG. 8 is a front view of the apparatus shown in FIG. 7.

FIGS. 7 and 8 illustrate another embodiment of the inline plasma vapor deposition apparatus of the present invention.

Figure 9:
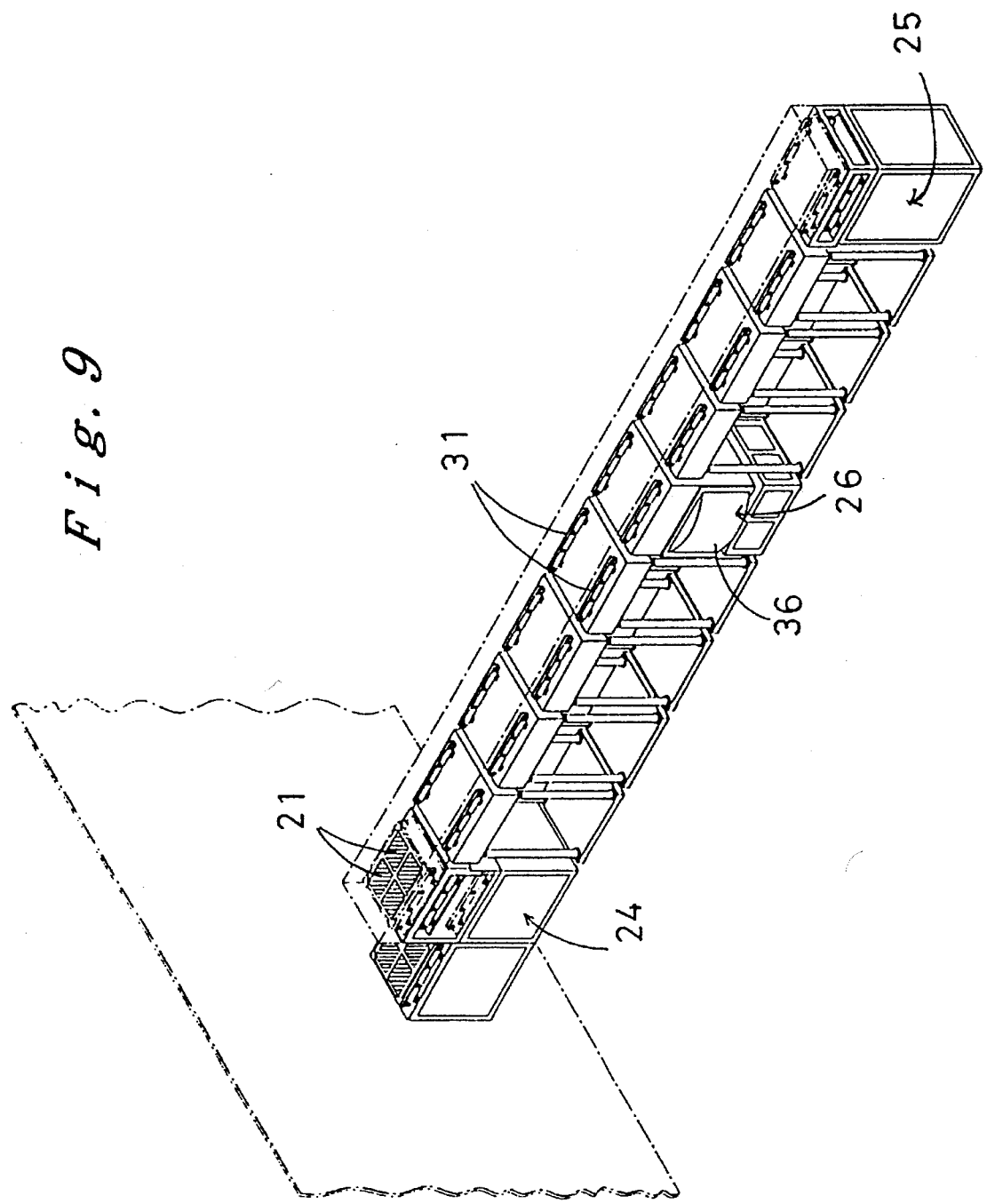
FIG. 9 is a perspective view of the apparatus shown in FIGS. 7 and 8.

As shown in the plan view of FIG. 7 and the front view of FIG. 8, the apparatus of this embodiment has an inlet-outlet section (23) in a region partitioned from a processing line of the apparatus, and pallet transport relay elevators (24) and (25) provided at both ends (inlet and outlet sections) of the line. The middle of the line includes one or more vapor deposition section(s) (26) independently evacuatable, and vacuum evacuating sections (27a) and (27b) disposed upstream and downstream of the same. The apparatus is provided with a return mechanism (31), shown in FIG. 9, for taking the transport pallet (22) (supporting the substrate (21)) from the vacuum chamber and returning the pallet (22) to the inlet/outlet section (23).

Figure 10:
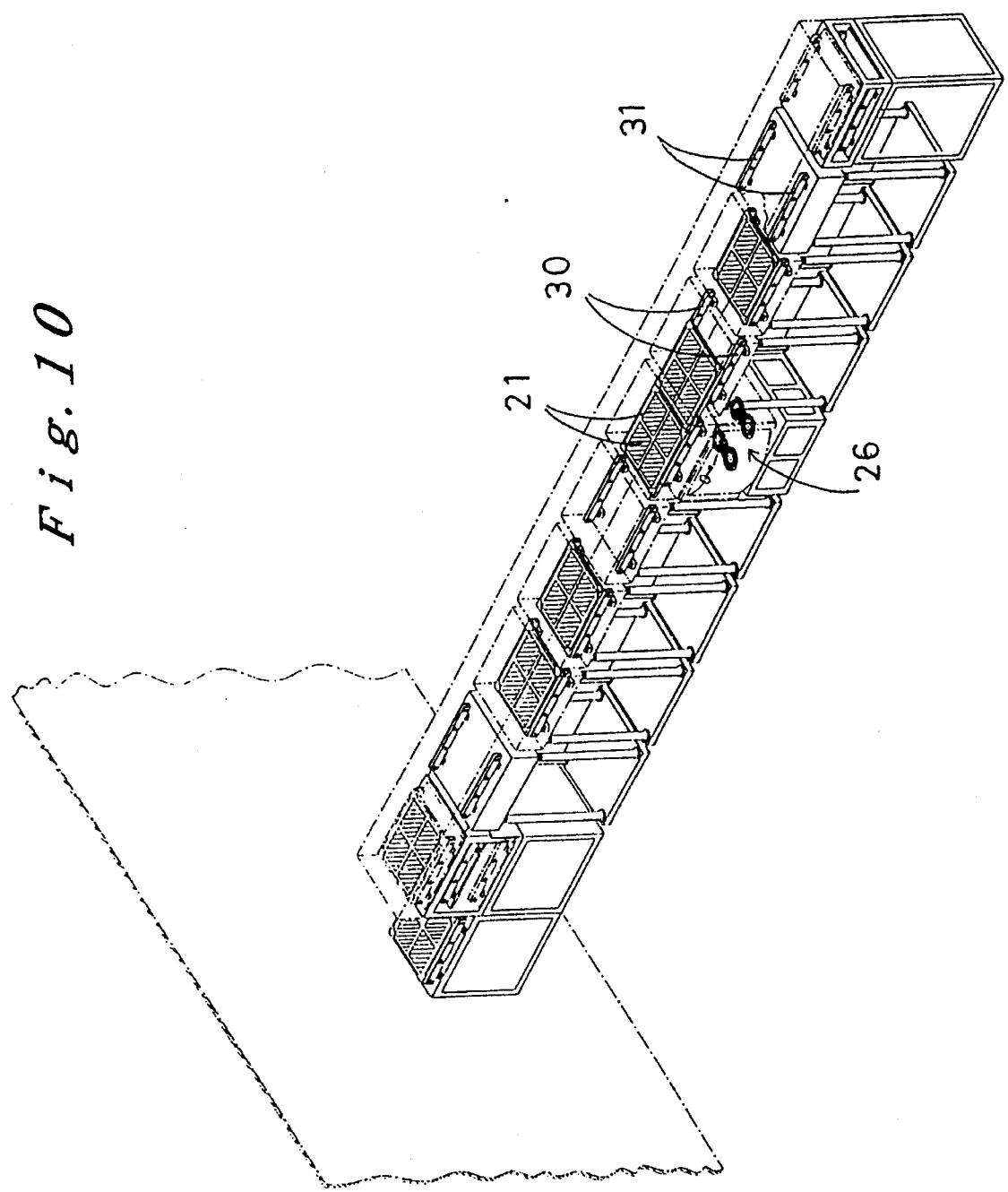
FIG. 10 is a perspective view, partially broken away, of the apparatus shown in FIG. 9.

Like the first embodiment, this apparatus has a transport means (30) for continuously transporting the substrate (21) along a first path through the vapor deposition section (26) and the vacuum evacuating sections (27a) and (27b). FIG. 10 illustrates the transportation of the substrate (21). The above-mentioned return mechanism (31) which is provided at the upper region of the line returns the pallet along a second path above the first path.

In the inline plasma vapor deposition apparatus described above, a vapor source material supply means comprises vapor source material (33) provided in a circular groove in a horizontally rotating holding plate (32) disposed in the vacuum chamber, and a high-frequency excitation means including coil-shaped electrodes disposed below the travelling substrate (21).

The substrate (21) is placed on the transport pallet (22) at the inlet-outlet section (23), and is sent to the relay elevator (24) by means of a transport mechanism. The substrate (21) is then transported to an inlet chamber (28a) by the transport means (30) comprising a rotary drive mechanism and a belt drive for transporting the substrate linearly. The substrate (21) is transported through the upstream vacuum evacuating section (27a) which is evacuated, and is introduced into the vapor deposition section (26) under a vacuum. In this vapor deposition section (26), the substrate (21) is subjected to a prescribed film forming treatment, and is then transported to the downstream vacuum evacuating section (27b). In this case, the substrate (21) may be preliminarily heated or subjected to a plasma treatment prior to film formation at a prescribed position in the vacuum evacuating section (27a). The vacuum evacuating sections (27a) and (27b) form a buffer for the vacuum de4position section (26). The individual vessels of the sections (26), (27a) and (27b) are connected by vacuum gate valves so that the vessels can be independently evacuated.

The substrate (21) having a film formed thereon is taken out of the outlet chamber (28b) and onto the pallet transport relay elevator (25) and is returned by means of the return mechanism (31) of a structure similar to that of the transport means (30).

The vapor deposition section (26) is provided with the high-frequency exciting means comprising coil-shaped electrodes. As shown in FIGS. 7 and 8 for example, a door (36) capable of being opened and closed is provided at the side of the vapor deposition section (26) with respect to the direction of travel of the substrate (21). The holding plate(s) (32) rotating horizontally supports the vapor source material (33) at a position below and spaced from the path along which the substrate (21) travels in a direction perpendicular to the direction of travel of the substrate (21). A replenishing mechanism (34) replenishes the vapor source material (34). The holding plate(s) (32) is rotated about a axis A by a driving means (37) so that the vapor source material (33) in the circular groove of the holding plate (32), for example, is continuously and uniformly evaporated. The vapor source material (33) can be continuously supplied to the holding plate (32) by the replenishing mechanism (34), as shown in FIG. 11.

The vapor source material (33) may be evaporated by an appropriate means such as a resistance heater, an induction heater, an electron beam (EB) source or ion beam source.

Figure 11:
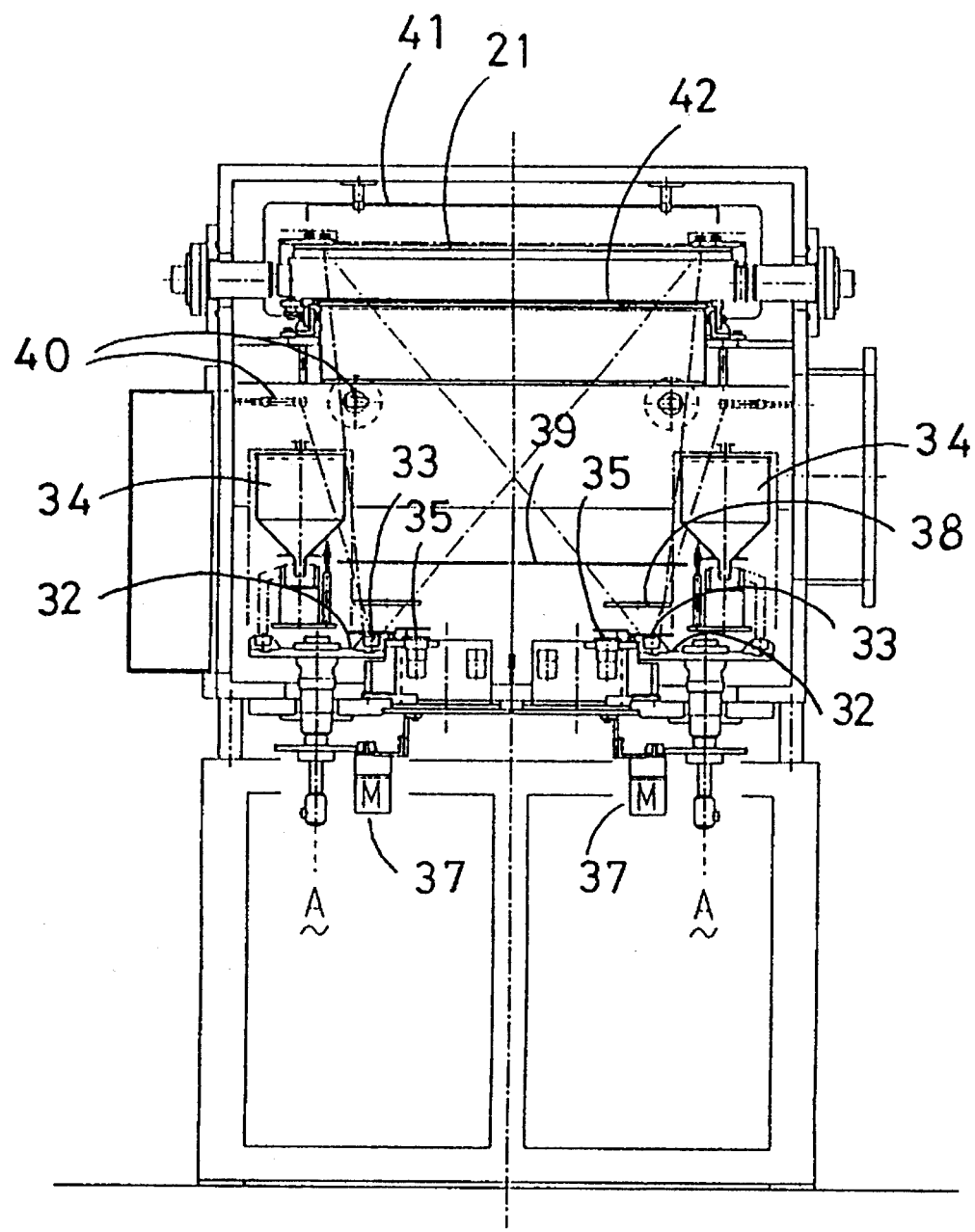
FIG. 11 is a cross-sectional view of the high-frequency exciting vapor deposition section of the apparatus shown in FIGS. 7–10.

In the embodiment shown in FIG. 11, the apparatus is provided with an electron beam source (35) to irradiate and thus evaporate the vapor source material (33). The particles are plasma-excited by the high-frequency exciting means comprising coil-shaped electrodes (39) as the vapor passes through the aperture of a shutter (38) controlling the spread of the vapor. The resulting ions and radicals form a film on the substrate (21).

By continuously evaporating the vapor source material (33) provided on the horizontally rotating holding plate (32), and spacing the vapor source supply means from the substrate (21) in a direction perpendicular to the direction of travel of the substrate (21), it is possible to form a uniform film on the substrate by evaporation of the vapor source material and exciting the particles of the vapor using plasma generated by the coil-shaped electrodes. Thus, uniform properties, such as those of the film structure, film thickness and adhering strength, can be imparted to the film. The state of the vapor source material (33) can be observed by means of a quartz monitor or an EIES monitor (40) comprising an exciting source effecting electronic bombardment.

Figure 12:
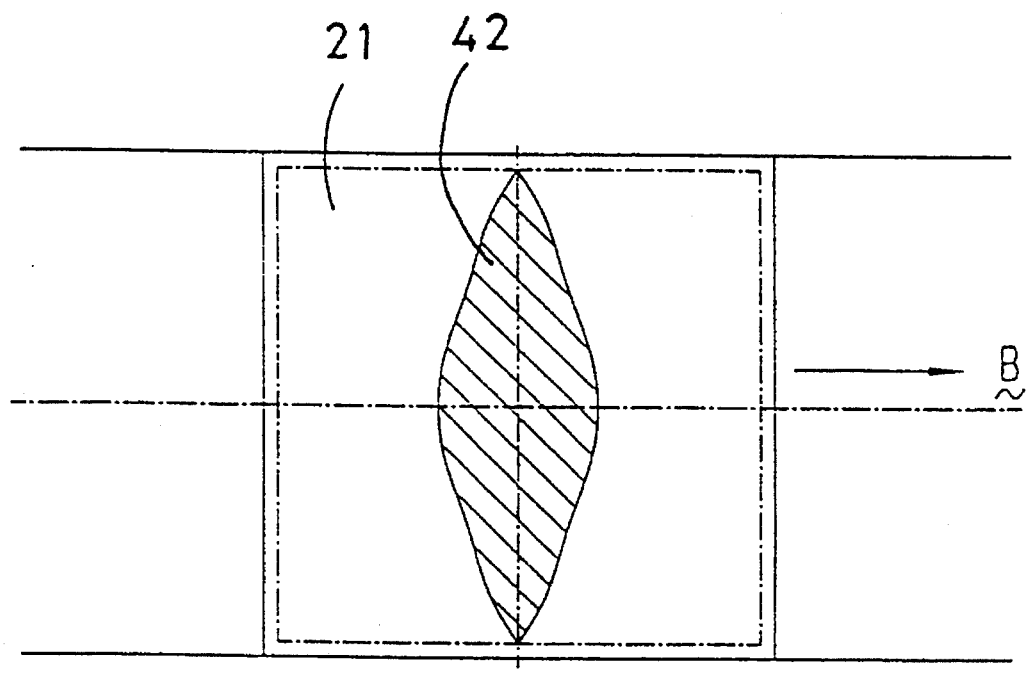
FIG. 12 is a plan view of the film thickness correcting plate of the same.

Although the film is formed during the travel of the substrate (21), the properties of the film are uniform. With a view to further ensuring this uniformity, a film thickness correcting plate (42) is provided. This correcting plate (42) ensures a uniform film thickness by preventing an excess of the excited particles from accumulating at a given site on the surface of the substrate (21), similar to the film thickness correcting plate of the first embodiment. In the case of this embodiment as shown in FIG. 12, the correcting plate (42) partially shields the substrate (21) as it travels in direction (B). Again, the shape of the plate will depend on the configuration of the vapor source material supply means, the type of vapor source material (33), and the condition of film formation.

It is desirable to provide a heater (41) so as to heat the substrate (21) from behind, as shown in FIG. 11.

The vapor deposition section (26) also includes means for impressing a bias voltage across the substrate (21), and means for supplying a reactive gas and an inert gas for producing the plasma.

High-frequency excited plasma can be produced by the coil-shaped electrodes (39) using conventional techniques. For example, the vacuum in the vapor deposition section (26) is about $2 \times 10^{-5}$ to $10^{-3}$ Torr; the vapor source material to be evaporated can consist of solids such as metals, alloys, inorganic matter or polymers; the inert gas can be argon or helium; and oxygen, nitrogen, hydrogen, and a hydrocarbon or a polymerizable monomer can be introduced into the vacuum chamber.

It is possible to form a high-quality ITO (indium-tin oxide) thin film on a glass substrate, for example, with high productivity by using ITO as the vapor source material and introducing an inert gas or oxygen gas into the vacuum chamber.

Figure 13:
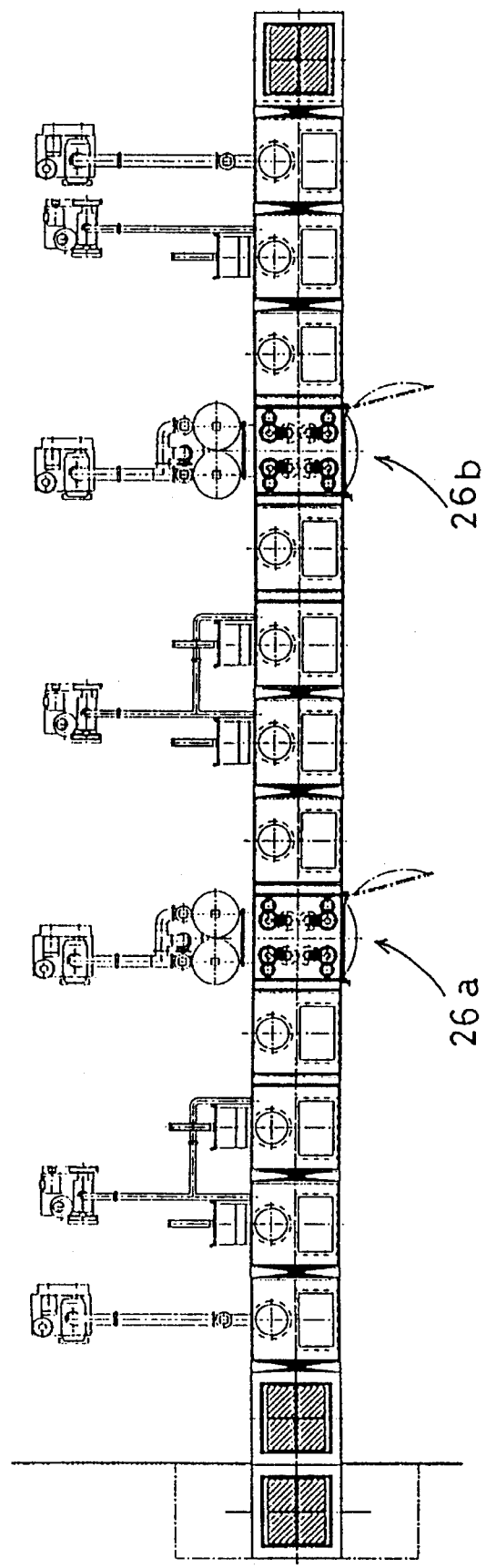
FIG. 13 is a plan view of still another embodiment of the inline vapor deposition apparatus.

Furthermore, using this embodiment it is possible to form another film of a different substance on a prescribed portion of a masked substrate or to form a multilayered film by providing another vapor deposition section downstream of the above-described vapor deposition section, as shown in FIG. 13, i.e. by providing a plurality of vapor deposition section s(26a) and (26b).

With this embodiment, a color filter substrate can be formed by, for example, plasma-vapor-depositing an organic thin film onto a metal or an inorganic matter, or plasma-vapor-depositing multiple layers of a pigment. A color filter can be continuously formed using an ITO film.

ITO films (1,500 A) can be continuously formed by an apparatus having a single vapor deposition section as shown in FIGS. 7 to 12, according to the following specifications:

o Film: ITO (1,500 A)

o Dimensions of mounting portion of carrier pallet where substrate is attached 840 mm wide×930 mm long o Number of substrates four 400 mm×450 mm substrates/carrier pallet o Film thickness distribution: within ±5% o Heating of substrate: 250° to 300° C. (350° C. max.)

o Throughput: minimum cycle time (two minutes)

o Daily production: 120 pieces/hr×24 hr/day=2,880 pieces/day o Electric power requires: 3-phase, 200 V about 200 kVA. 50/60 Hz.

In the case of the apparatus having two vapor deposition sections (26a) and (25b) as shown in FIG. 13, it is possible to form an ITO multilayered film or a multilayered film of $SiO_2$ and ITO.

Needless to say, various other conventional features can be incorporated into the apparatus of the present invention.

The above-described embodiments of the present invention possess the following excellent characteristics:

1) The high-frequency plasma vapor deposition process continuous supply of the vapor source material makes it possible to form a high-quality film with uniform properties such as structure, film thickness and adhering strength at a lower temperature.

2) Because the film formation occurs as the substrate passes continuously over the vapor source material, a very large throughput can be attained.

3) Continuous film formation of various film materials is possible.

4) Multilayered films can be formed employing a plurality of the vapor deposition sections.

5) Continuously supplying the vapor source material facilitates a stable and continuous formation of a film.

6) It is only necessary to provide an inlet-outlet section in the clean room when the return mechanism is employed.

What is claim is:

1. A vacuum plasma vapor deposition apparatus comprising: a vacuum chamber; a vapor material holding plate disposed in a lower portion of said vacuum chamber, said plate accommodating material to be evaporated; high-frequency exciting means, including a coil-shaped electrode disposed in the vacuum chamber above said vapor material holding plate, for exciting vapor produced by evaporating material accommodated by said vapor material holding plate; transporting means for continuously transporting a substrate through said vacuum chamber along a path located above said vapor material holding plate; and a film thickness correcting plate interposed between said vapor material holding plate and said path in the vacuum chamber, said film thickness correcting plate providing a shield, having a non-uniform width as taken in the direction in which said transport means transports a substrate through the vacuum chamber, which inhibits an excess of particles of vapor excited by said high frequency exciting means from accumulating at a given site on the surface of a substrate being transported continuously through the vacuum chamber by said transporting means, thereby ensuring that a film of a uniform thickness adheres to the surface of the substrate.

2. A vacuum plasma vapor deposition apparatus as claimed in claim 1, wherein said circular section is a circular groove in the holding plate.

3. A vacuum plasma vapor deposition apparatus as claimed in claim 1, and further comprising a shutter interposed between said holding plate and said film thickness correcting plate, said shutter defining an aperture through which vapor is allowed to pass from said holding plate toward the substrate transported through the vacuum chamber.

4. A vacuum vapor deposition apparatus comprising: a vacuum chamber; a plurality of vapor material holding plates disposed in a lower portion of the vacuum chamber, each of said holding plates having a circular section, on an upper surface of the plate, designated to accommodate material to be evaporated; drive means for rotating said vapor material holding plates about respective vertical axes passing through the centers of the circular sections of the holding plates, respectively; high-frequency exciting means, including a coil-shaped electrode, disposed in the vacuum chamber above said vapor material holding plates, for exciting vapors produced by evaporating materials accommodated in the circular sections of said vapor material holding plates; transporting means for continuously transporting a substrate through said vacuum chamber along a path located above said vapor material holding plates; the interior of said vacuum chamber being so open between said holding plates and said path that material evaporated from the circular sections of said holding plates form respective vapors that will concurrently form a thin film on the substrate transported through the vacuum chamber; and a film thickness correcting plate interposed between said vapor material holding plates and said path in the vacuum chamber, said film thickness correcting plate providing a shield, having a non-uniform width as taken in the direction in which said transporting means transports a substrate through the vacuum chamber, which inhibits an excess of particles of the vapors excited by said high frequency exciting means from accumulating at a given site on the surface of a substrate being transported continuously through the vacuum chamber by said transporting means, thereby ensuring that a film of a uniform thickness adheres to the surface of the substrate.

5. A vacuum vapor deposition apparatus as claimed in claim 4, wherein each of said circular sections is a circular groove in the holding plate.

6. A vacuum vapor deposition apparatus as claimed in claim 4, and further comprising shutters interposed between the circular sections of said holding plates and said film thickness correcting plate, said shutters defining apertures through which the vapors are allowed to pass from said holding plates toward the substrate transported through the vacuum chamber.

7. An inline plasma vapor deposition apparatus comprising: a processing line including at least one vapor deposition section, and evacuation sections disposed upstream and downstream of said vapor deposition section, said vapor deposition and said evacuation sections including independently evacuatable chambers; an inlet section including an elevator at one end of said processing line; an outlet section including an elevator at the other end of said processing line; transporting means for continuously transporting a substrate through the chambers of said at least one vapor deposition and said evacuation sections of the processing line from said inlet section to said outlet section, said transporting means including a pallet and means for guiding said pallet along a first path through said chambers, the elevators of said inlet and said outlet sections being vertically movable to respective positions aligned with said first path; return means for returning the pallet from said outlet section to said inlet section along a second path disposed above said first path, the elevators of said inlet and said outlet sections also being vertically movable to respective positions aligned with said second path; and the vapor deposition section including a vapor material holding plate accommodating material to be evaporated and disposed in a lower portion of the chamber of the vapor deposition section, and high-frequency exciting means, including a coil-shaped electrode disposed in the chamber of the vapor deposition section above said vapor material holding plate, for exciting vapor produced by evaporating said material.

8. An inline plasma vapor deposition apparatus as claimed in claim 7, wherein said vapor material holding plate has a horizontally extending surface including a circular section accommodating said material to be evaporated, and further comprising drive means for rotating said holding plate about a vertical axis passing through the center of said circular section.

9. An inline plasma vapor deposition apparatus as claimed in claim 8, wherein said circular section is a circular groove in the holding plate.

10. An inline plasma vapor deposition apparatus as claimed in claim 7, and further comprising a film thickness correcting plate interposed between said vapor material holding plate and said path in the chamber of the vapor deposition section, said film thickness correcting plate providing a shield, having a non-uniform width as taken in the direction in which said transporting means transports a substrate through the chamber, which inhibits an excess of particles of vapor excited by said high frequency exciting means from accumulating at a given site on the surface of a substrate being transported continuously through the vacuum chamber by said transporting means, thereby ensuring that a film of a uniform thickness adheres to the surface of the substrate.

11. An inline plasma vapor deposition apparatus as claimed in claim 10, and further comprising a shutter interposed between the circular section of said holding plate and said film thickness correcting plate, said shutter defining an aperture through which vapor is allowed to pass from said holding plate toward the substrate transported through the chamber of the vapor deposition section.

* * * * *